United States Patent
Kunst et al.

(10) Patent No.: US 7,379,156 B2
(45) Date of Patent: May 27, 2008

(54) LITHOGRAPHIC APPARATUS AND DEVICE MANUFACTURING METHOD

(75) Inventors: Ronald Casper Kunst, Eindhoven (NL); Yin Tim Tso, Eindhoven (NL); Youssef Karel Maria De Vos, Lille (BE); Ramidln Izair Kamidi, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 213 days.

(21) Appl. No.: 11/023,630

(22) Filed: Dec. 29, 2004

(65) Prior Publication Data

US 2006/0139590 A1 Jun. 29, 2006

(51) Int. Cl.
*G03B 27/42* (2006.01)
*G03B 27/58* (2006.01)
*G03B 27/62* (2006.01)

(52) U.S. Cl. .............................. 355/53; 355/72; 355/75
(58) Field of Classification Search ................ 355/53, 355/72–75; 318/649, 560, 565
See application file for complete search history.

(56) References Cited

U.S. PATENT DOCUMENTS

| | | | | |
|---|---|---|---|---|
| 5,812,396 A | * | 9/1998 | Kato | 700/61 |
| 6,714,842 B1 | * | 3/2004 | Ito | 700/302 |
| 7,098,990 B2 | * | 8/2006 | Butler | 355/53 |
| 2006/0119829 A1 | * | 6/2006 | Cox et al. | 355/72 |

\* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus includes an illumination system for conditioning a radiation beam. A support structure supports a patterning device, which is capable of imparting the radiation beam with a pattern in its cross-section to form a patterned radiation beam. A substrate table holds a substrate. A projection system projects the patterned radiation beam onto a target portion of the substrate. A motion control system includes a controller having a transfer function. The controller controls a position of the support structure and or the substrate table along a series of positions. The transfer function consists of a sum of a plurality of positional transfer functions, each determined in one of the positions, and each multiplied by a weighing function.

19 Claims, 3 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICS). In that circumstance, a patterning device, which is alternatively referred to as a mask or a reticle, may be used to generate a circuit pattern to be formed on an individual layer of the IC. This pattern can be transferred onto a target portion (e.g. Including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, high-precision motion control systems may be found for performing the stepping and scanning operations. In such a motion control system, motion controllers are used to control actuators which, e.g., move a mask table or reticle stage RS, or a substrate table or wafer stage WS in several degrees of freedom.

An objective in designing such motion controllers is to guarantee robustness of the associated motion system, and to obtain a high bandwidth. In particular, it is desirable to guarantee robustness for variations of the system which arise from position dependent dynamics, from variations of mechanical properties of materials used, such as stiffness or damping properties, and from the mass of the object moved, which may be influenced by different reticles or wafers having different masses and being connected thereto. As an example, it is desirable that the motion controller be robust for all positions of the object moved, taking into account that the point on an object, such as a support structure or substrate table, where a position thereof is measured changes during a scan, e.g. as a result of mechanical eigen frequencies of the object.

However, since the motion controller should be stable for all of these variations in different positions of the object, the bandwidth of the motion system may be limited. A limited bandwidth of the motion control system limits the settling time and the throughput of the lithographic apparatus.

SUMMARY

It is desirable to increase the bandwidth of the motion system.

According to an embodiment of the invention, there is provided a lithographic apparatus including: an illumination system configured to condition a radiation beam; a support structure constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a motion control system including a controller having a transfer function for controlling a position of at least one of the support structure and the substrate table along a series of positions, wherein the transfer function consists of a sum of a plurality of positional transfer functions, each determined in a respective one of the positions, and each multiplied by a weighing function.

According to an embodiment of the invention, there is provided a lithographic apparatus arranged to transfer a pattern from a patterning device onto a substrate, including: a movable object; a motion control system including a controller having a transfer function for controlling a position of said object along a series of positions, wherein the transfer function consists of a sum of a plurality of positional transfer functions, each determined in a respective one of said positions, and each multiplied by a weighing function.

According to an embodiment of the invention, there is provided a device manufacturing method including transferring a pattern from a patterning device onto a substrate, wherein a position of a movable object along a series of positions is controlled by a controller having a transfer function for controlling a position of said object along a series of positions, and wherein the transfer function consists of a sum of a plurality of positional transfer functions, each determined in a respective one of the positions, and each multiplied by a weighing function.

In an embodiment of the invention, there is provided a motion control system configured to control movement of movable object, the system including: a controller having a transfer function and configured to control a position of the object along a plurality of positions, wherein the transfer function includes a sum of a plurality of positional transfer functions, each of the plurality of positional transfer functions being determined at one of the positions, and each of the plurality of positional transfer functions being multiplied by a weighing function.

In another embodiment of the invention, there is provided a lithographic apparatus including: an illumination system configured to condition a radiation beam; a patterning device support constructed to support a patterning device, the patterning device being capable of imparting the radiation beam with a pattern in its cross-section to form a patterned radiation beam; a substrate support constructed to hold a substrate; a projection system configured to project the patterned radiation beam onto a target portion of the substrate; and a motion controller configured to control a position of at least one of the supports along a plurality of positions, the controller having a transfer function including a sum of a plurality of positional transfer functions, each of the positional transfer functions being determined at one of the positions, and each of the positional transfer functions being multiplied by a weighing function.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
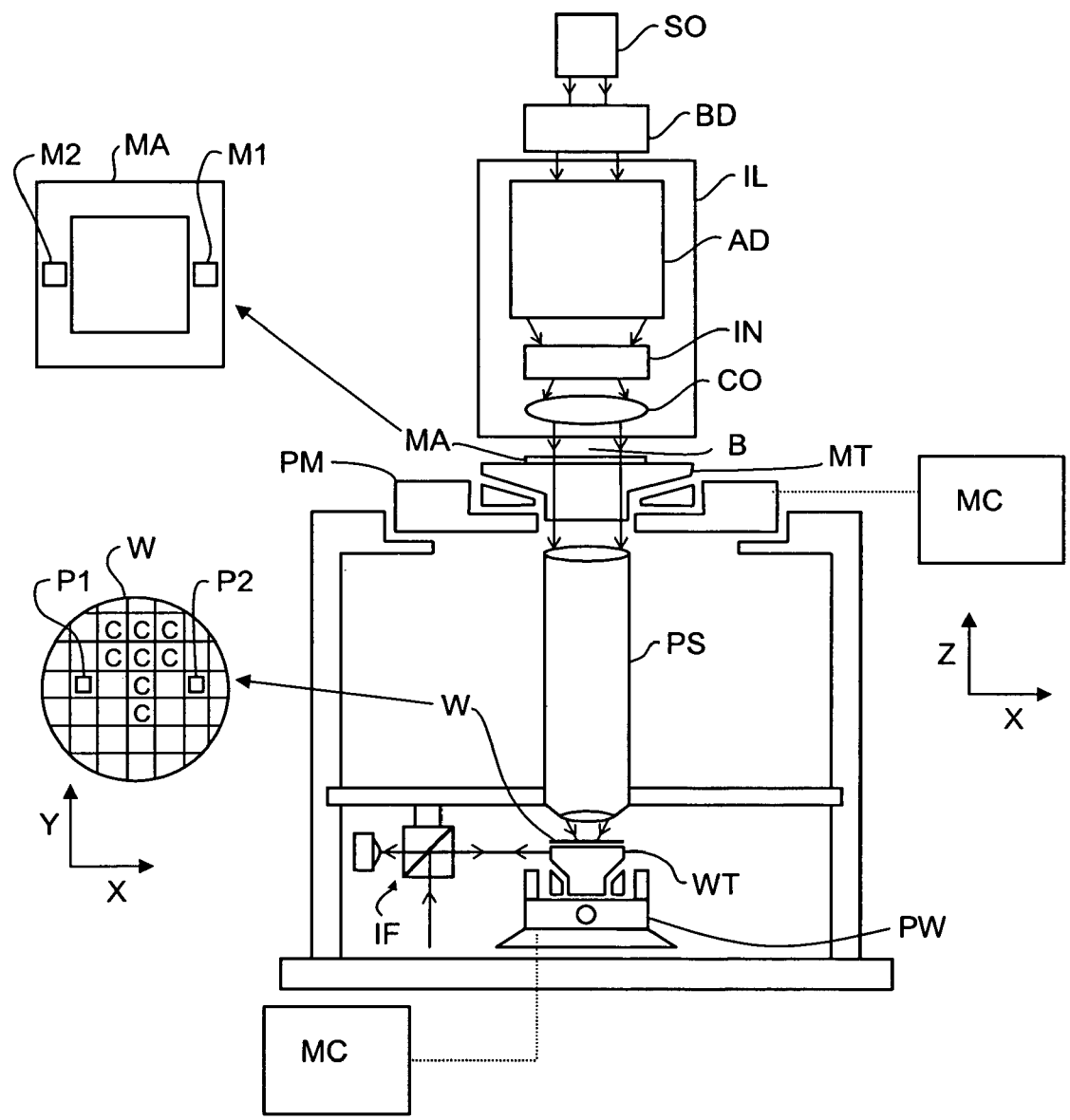
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), and a support structure, or patterning device support, (e.g. a mask table) MT constructed to support a patterning device (e.g. a mask) MA and connected to a first positioner PM configured to accurately position the patterning device in accordance with certain parameters. The apparatus also includes a substrate table, or substrate support, (e.g. a wafer table) WT constructed to hold a substrate (e.g. a resist-coated wafer) W and connected to a second positioner PW configured to accurately position the substrate in accordance with certain parameters, and a motion control system MC for controlling a position of the support structure, or patterning device support, MT by the first positioner PM and/or the substrate table, or substrate support, WT by the second positioner PW. The apparatus further includes a projection system (e.g. a refractive projection lens system) PS configured to project a pattern imparted to the radiation beam B by patterning device MA onto a target portion C (e.g. Including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure, or patterning device support, supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure, or patterning device support, can use mechanical, vacuum, electrostatic or other clamping techniques to hold the patterning device. The support structure, or patterning device support, may be a frame or a table, for example, which may be fixed or movable as required. The support structure, or patterning device support, may ensure that the patterning device is at a desired position, for example with respect to the projection system. Any use of the terms "reticule" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type if projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure, or patterning device support, (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table, or substrate support, WT may be realized using a long-stroke module and a short-stroke module, which form part of the second positioner PW. In the case of a stepper (as opposed to a scanner) the mask table, or substrate support, MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT, or patterning device support, and the substrate table WT, or substrate support, are kept essentially stationary, while an entire pattern imparted to the radiation beam is projected onto a target portion C at once (i.e. a single static exposure). The substrate table, or substrate support, WT is then shifted in the X and/or Y direction so that a different target portion C can be exposed. In step mode, the maximum size of the exposure field limits the size of the target portion C imaged in a single static exposure.

Scan mode: the mask table, or patterning device support, MT and the substrate table, or substrate support, WT are scanned synchronously while a pattern imparted to the radiation beam is projected onto a target portion C (i.e. a single dynamic exposure). The velocity and direction of the substrate table, or substrate support, WT relative to the mask table, or patterning device support, MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table, or patterning device support, MT is kept essentially stationary holding a programmable patterning device, and the substrate table, or substrate support, WT is moved or scanned while a pattern imparted to the radiation beam is projected onto a target portion C. In this mode, generally a pulsed radiation source is employed and the programmable patterning device is updated as required after each movement of the substrate table, or substrate support, WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
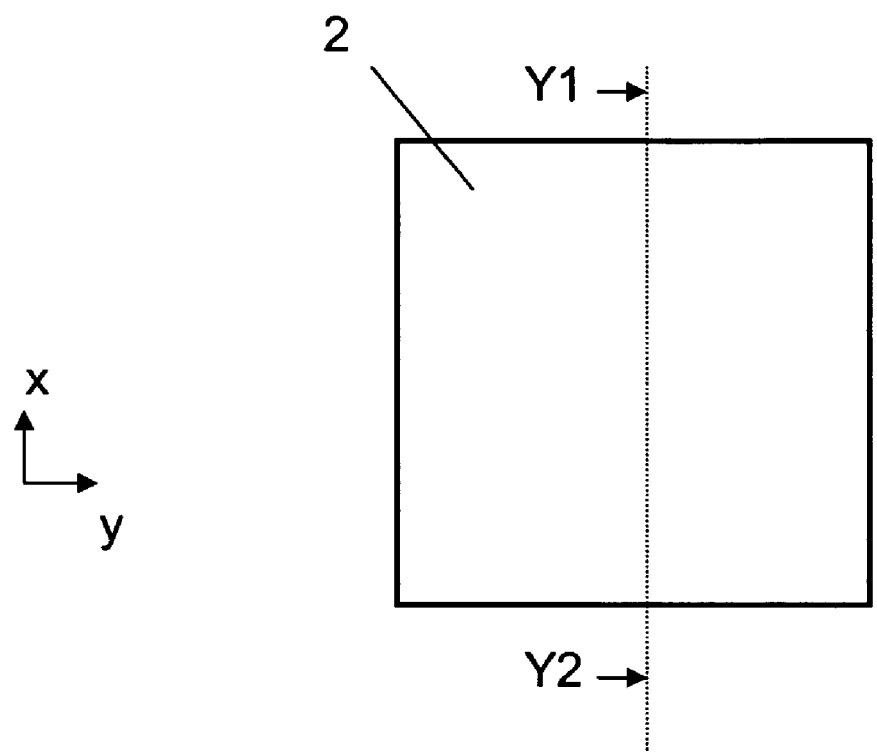
FIG. 2 schematically illustrates the measurement of positions of an object.

Referring to FIGS. 1 and 2, the controlled movement of an object in a lithographic apparatus is illustrated with reference to an object 2, such as a reticule stage. The position (with six degrees of freedom) of the object 2 is determined with respect to the center of the projection system PS (in logical x, y and z axes (FIG. 1)). In case of a reticule stage, for the horizontal x, y axis this may be done with encoders, which are mounted on the top of the projection system PS, and which are not shown in further detail. For the vertical z axis this may be done with the capacitive sensors, which are also mounted on the top of the projection system PS, and which are not shown in further detail. By using a measurement system matrix the signals measured with all these sensors are converted into logical 6 degrees of freedom x, y, z, rx, ry and rz axes. During a scan, the object 2 is moved in y direction and the point on the object where the sensors measure changes. In case of a reticule stage, for the encoders this implies that the position of measurements on the encoder rulers changes in y direction. For the capacitive sensors it implies that a measuring spot on part of the projection system PS beneath the reticule stage also shifts in y direction. In FIG. 2, outer y measuring positions y1 and y2 are shown, while measuring in a center of the object 2.

To compensate for variations in dynamics due to the fact that a center of gravity of the reticule stage shifts with respect to the center of the projection system PS, a compensator (Gain Scheduling matrix) may be used in a controller (part of the motion control system) associated with the object 2 (compensated mechanics). However, the compensator may only compensate for rigid body effects. Since the object 2 is not a rigid body, it has eigen frequencies with the associated mode shapes. While the points of position measurement on the object 2 change depending on the y position, these mode shapes will be measured differently and the measured dynamics of the object 2 also change. For these internal dynamics the compensator may not compensate.

Since the properties of the material of which the object is made may be considered substantially linear for the different mode shapes, it may be assumed that the measured amplitude of a mode shape will change almost linearly with the y position. If the system is described in a state space equation, we obtain a linear parametrically varying (LPV) position dependent system:

$$\dot{x} = A(y)x + B(y)u$$

The A and the B matrices are linear functions of the position y. In this case y is equal to the setpoint in y. This implies that the transfer function of the object 2 can be measured in a number of positions and the associated transfer functions can be interpolated to obtain the transfer functions at positions between the measured positions. According to the relationship (1) below, the following functions can be used for the position dependent transfer function $H_{CM}$:

$$H_{CM}(s, y) = \sum_{i=1}^{n} \omega_i(y) H_{CM}^i(s) \quad (1)$$

where:

H denotes a transfer function

Figure 3:
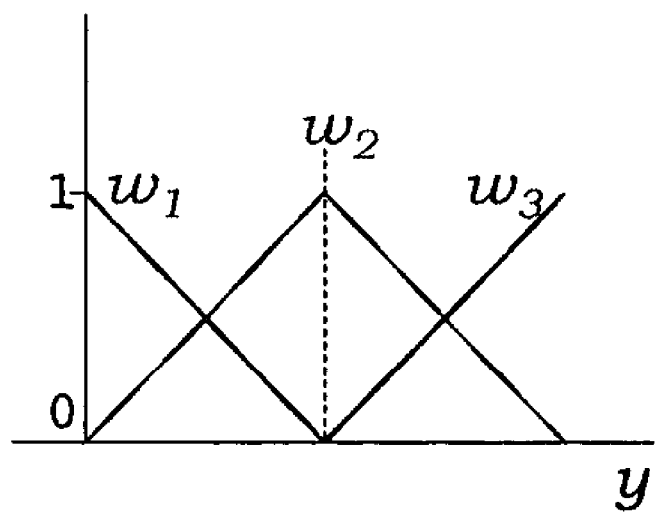
FIG. 3 illustrates scheduling functions.

CM denotes a relation to compensated mechanics s is the Laplace operator (s=jω)

with linear scheduling functions (also referred to as weighing functions) which may be linearly dependent on the position y. As illustrated in FIG. 3, the scheduling functions have the following characteristic (where FIG. 3 shows three scheduling functions, as an example):

$$\sum_{i=1}^{n} \omega_i(y) = 1,$$

$$\omega_i(y) \geq 0 \,\forall\, y$$

According to tests performed, measurements of the transfer function in several positions show that the position dependent transfer function can be modeled as a LPV model and that the assumption that the transfer function changes almost linearly with the y position is true.

Figure 4:
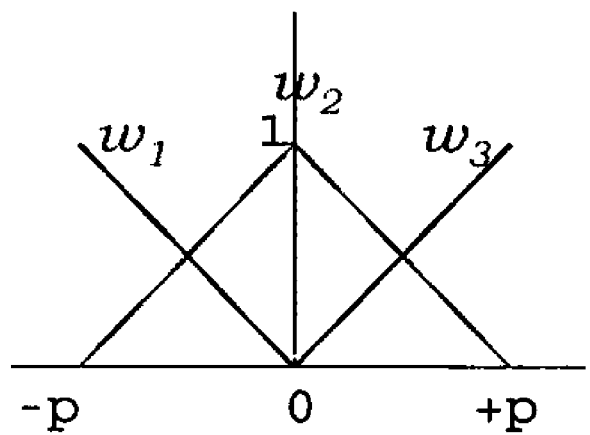
FIG. 4 illustrates the use of scheduling functions at different positions.

As illustrated in FIG. 4, the transfer function of the z compensated mechanics of the positioning of the object may be measured in, e.g., three y positions, −p, 0 and +p mm (where p is a arbitrary number). The position dependent transfer function can be modeled with the following function:

$$H_{CM}(s, y) = \omega_1(y) H_{CM}^{y=-p}(s) + \omega_2(y) H_{CM}^{y=0}(s) + \omega_3(y) H_{CM}^{y=+p}(s)$$

In order to validate this function, the compensated mechanics were measured in several positions, and compared with the transfer functions of the model. From these measurements it has appeared that the transfer function can be described by the LPV model as developed above.

It is noted that even if the dynamics do not change linearly with the position, it is still possible to model the compensated mechanics with the function according to relationship (1) above. Further, if the function of the change of the dynamics with the position y is determined, e.g. by using a FEM model or by modal analysis, then this function can be used in the scheduling functions. Thus, the scheduling functions need not be linear but may also be non-linear functions. In the latter case, measurements in more positions may be necessary. Also, compensation by non-linear functions lead to higher bandwidths in the dynamics, and thus to lower settling times and higher throughputs of the apparatus concerned.

Although specific reference may be made in this text to the use of lithographic apparatus in the manufacture of ICS, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may have been made above to the use of the controller according to the invention for moving a reticule stage and/or a wafer stage, the controller may be used to move an arbitrary object in the lithographic apparatus.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam;
    a patterning device support constructed to support a patterning device, the patterning device being capable of imparting the radiation beam with a pattern in its cross-section to form a patterned radiation beam;
    a substrate support constructed to hold a substrate;
    a projection system configured to project the patterned radiation beam onto a target portion of the substrate; and
    a motion controller configured to control a position of at least one of said supports along a plurality of positions, said controller having a transfer function including a sum of a plurality of positional transfer functions, each of said positional transfer functions being determined at one of said positions, and each of said positional transfer functions being multiplied by a weighing function.

2. The lithographic apparatus of claim 1, wherein the positional transfer function is linear.

3. The lithographic apparatus of claim 1, wherein the weighing function is a linear function that is position dependent.

4. The lithographic apparatus of claim 1, wherein the sum of the weighing functions is substantially equal to one.

5. The lithographic apparatus of claim 1, wherein said at least one of said supports is the patterning device support.

6. The lithographic apparatus of claim 1, wherein said at least one of said supports is the substrate support.

7. The lithographic apparatus of claim 1, wherein said motion controller is configured to control a position of both of said supports along a plurality of positions.

8. The lithographic apparatus of claim 6, further comprising an additional motion controller having a transfer function and configured to control a position of the patterning device support along a plurality of positions.

9. A lithographic apparatus arranged to transfer a pattern from a patterning device onto a substrate, comprising:
 a movable object; and
 a motion control system comprising a controller having a transfer function and configured to control a position of said object along a plurality of positions,
 wherein said transfer function includes a sum of a plurality of positional transfer functions, each of said plurality of positional transfer functions being determined at one of said positions, and each of said plurality of positional transfer functions being multiplied by a weighing function.

10. The lithographic apparatus of claim 9, wherein said movable object is a patterning device support configured to support the patterning device.

11. The lithographic apparatus of claim 9, wherein said movable object is a substrate support configured to hold the substrate.

12. A device manufacturing method comprising:
 transferring a pattern from a patterning device onto a substrate; and
 controlling a position of a movable object along a plurality of positions with a controller,
 wherein said controller has a transfer function and is configured to control the position of said object along said plurality of positions, and
 wherein said transfer function includes a sum of a plurality of positional transfer functions, each of said plurality of positional transfer functions being determined at one of said positions, and each of said plurality of positional transfer functions being multiplied by a weighing function.

13. The method of claim 12, wherein said movable object is a patterning device support configured to support the patterning device.

14. The method of claim 12, wherein said movable object is a substrate support configured to hold said substrate.

15. The method of claim 12, further comprising controlling a position of another movable object along a plurality of positions with an additional controller, such that both said controller and said additional controller each have a transfer function that includes a sum of a plurality of positional transfer functions and are configured to control the position of their respective object,
 wherein each of said plurality of positional transfer functions is determined at one of said positions of their respective object,
 wherein each of said plurality of positional transfer functions is multiplied by a weighing function,
 wherein said movable object is a patterning device support configured to support the patterning device, and
 wherein said another movable object is a substrate support configured to support the substrate.

16. The lithographic apparatus of claim 9, wherein the positional transfer function is linear.

17. The lithographic apparatus of claim 9, wherein the weighing function is a linear function that is position dependent.

18. The lithographic apparatus of claim 9, wherein the sum of the weighing functions is substantially equal to one.

19. The lithographic apparatus of claim 9, wherein said movable object comprises a patterning device support configured to support the patterning device and a substrate support configured to hold the substrate, and wherein said motion control system is configured to control a position of both of said supports along a plurality of positions.

* * * * *